United States Patent
Tsunoda

(10) Patent No.: US 8,829,465 B2
(45) Date of Patent: Sep. 9, 2014

(54) CHARGED PARTICLE BEAM LENS HAVING A PARTICULAR SUPPORT ELECTRICALLY INSULATING FIRST AND SECOND ELECTRODES FROM EACH OTHER

(75) Inventor: Koichi Tsunoda, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 14/118,963

(22) PCT Filed: May 10, 2012

(86) PCT No.: PCT/JP2012/062572
§ 371 (c)(1),
(2), (4) Date: Nov. 20, 2013

(87) PCT Pub. No.: WO2012/172913
PCT Pub. Date: Dec. 20, 2012

(65) Prior Publication Data
US 2014/0103223 A1 Apr. 17, 2014

(30) Foreign Application Priority Data
Jun. 14, 2011 (JP) .................. 2011-131963

(51) Int. Cl.
*H01J 37/12* (2006.01)
*H01J 37/00* (2006.01)
*H01J 37/317* (2006.01)

(52) U.S. Cl.
CPC ............ *H01J 37/12* (2013.01); *H01J 37/3177* (2013.01); *H01J 2237/1205* (2013.01); *H01J 2237/03* (2013.01)
USPC .......... 250/396 ML; 250/396 R; 250/492.22; 250/491.1

(58) Field of Classification Search
USPC ............... 250/396 R, 396 ML, 492.22, 491.1
See application file for complete search history.

(56) References Cited

U.S. PATENT DOCUMENTS

| 2,940,020 A | 6/1960 | Müller |
| 5,177,366 A | 1/1993 | King et al. |

(Continued)

FOREIGN PATENT DOCUMENTS

| JP | 2006-049702 A | 2/2006 |
| WO | 2009/014406 A2 | 1/2009 |

OTHER PUBLICATIONS

Notification of and International Search Report completed Aug. 3, 2012, and mailed on Aug. 13, 2012, in counterpart International Application No. PCT/JP2012/062572.
Written Opinion mailed on Aug. 13, 2012, in counterpart International Application No. PCT/JP2012/062572.
Yamamoto, Osamu, et al., "Insulation peformance and Flashover Mechanism of Bridged Vacuum Gaps," T. IEE Japan, vol. 110-A, No. 12, 1980, pp. 830-838.

(Continued)

*Primary Examiner* — David A Vanore
(74) *Attorney, Agent, or Firm* — Fitzpatrick, Cella, Harper & Scinto

(57) ABSTRACT

A charged particle beam lens includes a first electrode including a surface having at least one aperture and a second electrode including a surface having at least one aperture. A support intervenes between the first electrode and the second electrode to electrically insulate the first and second electrodes from each other and to support the first and second electrodes in a predetermined positional relationship. A side surface of the support intervenes between the first electrode and the second electrode and includes a non-flat portion having at least one of a projected portion and a depressed portion, and includes a tapered portion. A taper angle formed by the tapered portion and the surface having the aperture of the second electrode is greater than zero degree and less than ninety degrees.

6 Claims, 7 Drawing Sheets

(56) References Cited

U.S. PATENT DOCUMENTS

| | | | |
|---|---|---|---|
| 6,872,950 B2 * | 3/2005 | Shimada et al. | 250/396 R |
| 7,329,878 B2 * | 2/2008 | Kim | 250/396 R |
| 8,466,430 B2 * | 6/2013 | Sando | 250/396 R |
| 2010/0200766 A1 | 8/2010 | Kim | |
| 2012/0319001 A1 * | 12/2012 | Tsunoda | 250/396 R |

OTHER PUBLICATIONS

International Preliminary Report on Patentability issued on Dec. 17, 2013, and mailed on Jan. 3, 2014, in corresponding International Application No. PCT/JP2012/062572.

* cited by examiner

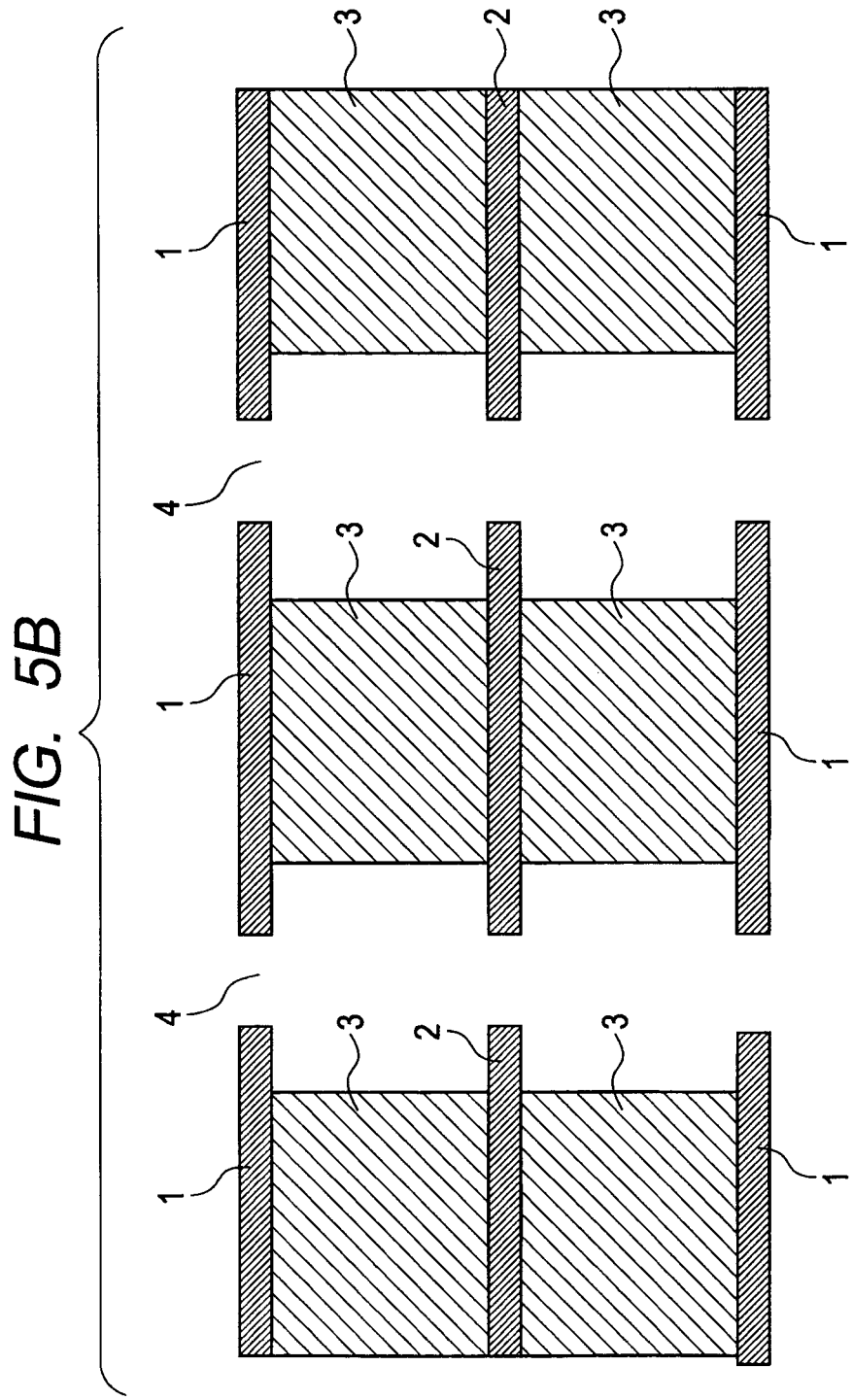

CHARGED PARTICLE BEAM LENS HAVING A PARTICULAR SUPPORT ELECTRICALLY INSULATING FIRST AND SECOND ELECTRODES FROM EACH OTHER

This application claims the benefit of Japanese Patent Application No. 2011-131963, filed Jun. 14, 2011, which is hereby incorporated by reference herein in its entirety.

TECHNICAL FIELD

The present invention relates to a technique in the field of charged particle optical systems used in apparatuses using a charged particle beam, such as an electron beam, and, more particularly, to a charged particle lens used in an exposure device.

BACKGROUND ART

In the production of semiconductor devices, an electron beam exposure technique is a major candidate for enabling exposure of a micropattern not larger than 0.1 micrometer. An exposure device using such an electron beam exposure technique employs an electro-optical element for controlling optical characteristics of an electron beam. Electron lenses include electromagnetic ones and electrostatic ones. In particular, an electrostatic electron lens does not require a coil core, has a simpler configuration, and is more easily downsized, compared to an electromagnetic electron lens. A multi-beam system for simultaneously drawing patterns (without using any mask) by a plurality of electron beams has been proposed among electron beam exposure techniques.

An electrostatic charged particle beam lens has a structure in which electrodes are stacked with an insulator between the electrodes. When an electrical field is applied between the electrodes, a point at which a surface of the insulator, a surface of the electrodes, and a space are in contact with each other serves as a triple junction. At the triple junction, electrons are emitted from the surface of the electrode serving as a cathode due to the electrical field concentration effect. The emitted electrons directly collide with the insulator or enter the insulator after reaching an anode and being reflected from the anode to electrically charge the surface of the insulator. The electrical charge on the surface of the insulator results in the generation of an electrical field. The electrical field may deflect the trajectory of an electron beam.

To cope with such a problem, there has been proposed the idea of inhibiting electrification of the surface of an insulator by forming unevenness at the surface of the insulator (see Japanese Patent Application Laid-Open No. 2006-49702). There is also available a proposal for tapering a surface of an insulator and changing the state of an electrical field at and near a triple junction by adjusting the taper angle (see, e.g., Osamu Yamamoto et al., "Insulation performance and flashover mechanism of bridged vacuum gaps, "T. IEE Japan, Vol. 110-A, No. 12, 1980).

SUMMARY OF THE INVENTION

Technical Problem

Application of the proposed methods alone, however, does not easily enable sufficient control of the trajectory of an electron emitted from a triple junction. Accordingly, emitted electrons may vary widely in initial trajectory and in position of collision with an insulator. The variation may result in insufficient stability in the charged state of the surface of the insulator to affect the trajectory of an electron beam.

Solution to the Problem

In consideration of the above-described problem, a charged particle beam lens according to the present invention includes a first electrode including a surface having at least one aperture and a second electrode including a surface having at least one aperture. The lens also includes a support intervening between the first electrode and the second electrode to electrically insulate the first and second electrodes from each other and to support the first and second electrodes. A side surface of the support intervening between the first electrode and the second electrode includes a non-flat portion having at least one of a projected portion and a depressed portion and includes a tapered portion of a tapered shape. An angle formed by the tapered portion and the surface having the aperture of the second electrode is larger than zero degrees and less than ninety degrees.

Advantageous Effects of the Invention

According to the charged particle beam lens of the present invention, formation of the non-flat portion enables inhibition of the amount of electrical charge on the surface of the support. Additionally, formation of the tapered portion enables generation of an electrical field where a charged particle emitted from a triple junction receives a force in a direction away from the support around the tapered portion. Therefore, a charged particle emitted from the triple junction follows a trajectory leaving from the support, and the electrification-induced power to attract a charged particle is inhibited in the non-flat portion due to the reduced amount of electrical charge. Accordingly, a flying charged particle tends to reach an electrode on the other side before colliding with the support, or tends to collide with the support and stay there, because the flying charged particle is unlikely to generate a secondary charged particle due to reduced energy of the collision. It is thus possible to inhibit the charged state of the support from fluctuating due to collision of a charged particle emitted from the triple junction and to inhibit effects on the trajectory of a charged particle beam passing through the aperture in the electrodes.

Further features of the present invention will become apparent from the following description of exemplary embodiments with reference to the attached drawings.

BRIEF DESCRIPTION OF THE DRAWINGS

FIG. 5B is a diagram and a view for describing a charged particle beam exposure device according to an embodiment of the present invention.

DESCRIPTION OF THE EMBODIMENTS

A charged particle beam lens according to the present invention is characterized in that a side surface of a support intervening between electrodes (a surface extending between the electrodes) includes a non-flat portion and a tapered portion, and that a taper angle formed by the tapered portion and a surface having an aperture of the electrodes is greater than zero degrees and less than ninety degrees. The non-flat portion is formed on the side of one of the electrodes, and the tapered portion is formed on the side of the other electrode. The non-flat portion and the tapered portion may be formed so as to be completely separate from each other or so as to overlap at least partially with each other. The non-flat portion inhibits the charged state of the support from fluctuating mainly by trapping a charged particle entering a depressed portion by a projected portion. The tapered portion inhibits the charged state of the support from fluctuating mainly by separating a charged particle away from the support. In any case, these two portions work in concert with each other to inhibit the charged state of the support from fluctuating. The non-flat portion and the tapered portion are desirably separated from each other from the viewpoint of sufficient fulfillment of the function of inhibiting the charged state of the support from fluctuating by separating from the support a charged particle from the tapered portion and trapping a charged particle in the non-flat portion, easy processing, structural compactness, and so on. However, depending on the overall design, the material used, and the like, the above-mentioned function is sufficiently fulfilled even if the non-flat portion and the tapered portion are formed so as to partially or to completely overlap with each other. Thus, such an overlapped structure can be used.

First Embodiment

Figure 1A:
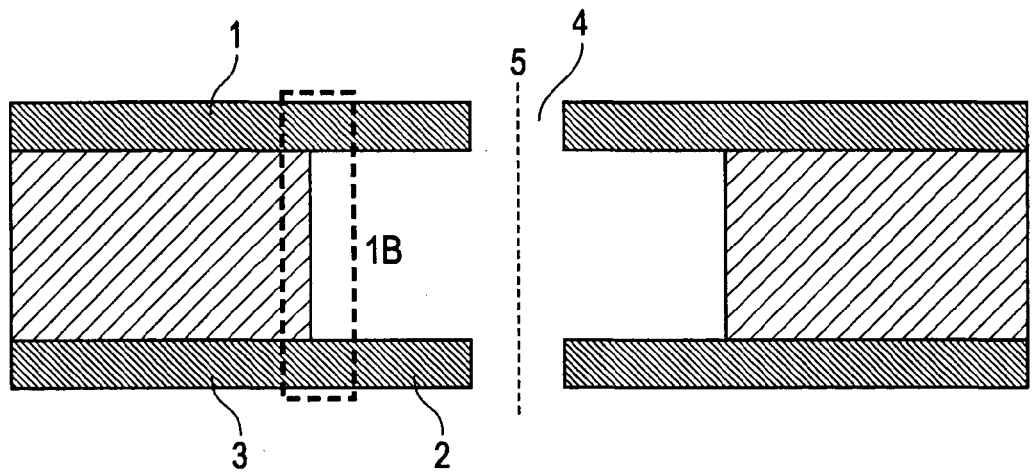
FIG. 1A is a cross-sectional view for describing a charged particle beam lens according to an embodiment of the present invention.

A first embodiment of the present invention will be described with reference to FIGS. 1A to 1C and 2A to 2C. FIG. 1A is a cross-sectional view of a charged particle beam lens according to the present embodiment with the details omitted, and FIG. 1B is an enlarged view illustrating the details of the area 1B surrounded by the dotted line in FIG. 1A.

As illustrated in FIG. 1A, the charged particle beam lens according to the present embodiment includes two electrodes, a first electrode 1 and a second electrode 2. The two electrodes are electrically insulated and separated from each other by a support 3 intervening between the electrodes and are supported in a predetermined positional relationship. An aperture 4 of the electrodes 1 and 2 lets a charged particle beam emitted from a light source (not shown) pass through. The aperture 4 in the electrodes 1 and 2 is arranged such that a central axis 5 is substantially common to the electrodes and defines an optical axis of the lens.

Figure 1B:
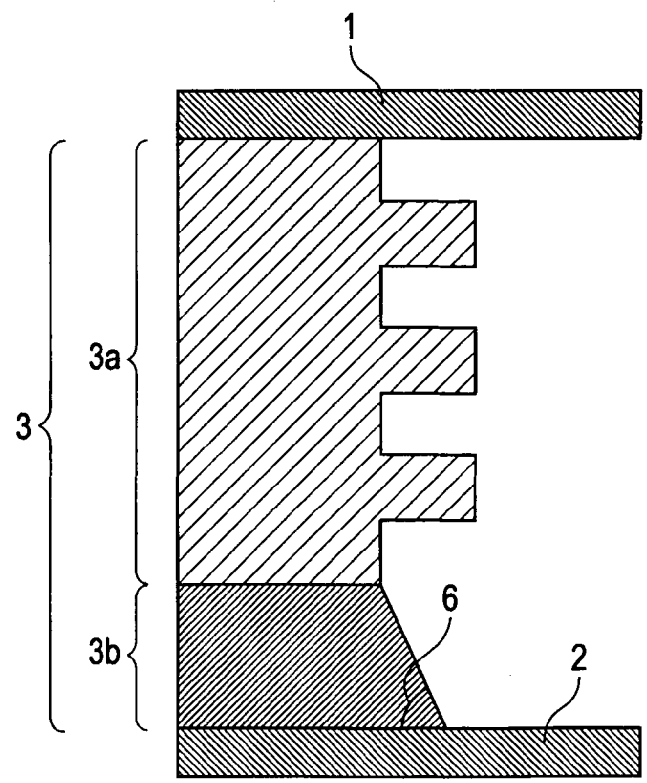
FIG. 1B is a cross-sectional view for describing a charged particle beam lens according to an embodiment of the present invention.

As illustrated in FIG. 1B, a side surface of the support 3 intervening between the electrodes 1 and 2 (a surface of the support 3 extending between the electrodes 1 and 2) includes a non-flat portion 3a having one of a projected portion and a depressed portion on the first electrode side and includes a tapered portion 3b on the second electrode side. A taper angle 6 of the tapered portion 3b formed by the tapered portion and a surface having the aperture 4 of the second electrode 2 is greater than zero degrees and less than 90 degrees. A surface of the tapered portion 3b can be curved or stepped, as needed. A tip position of the tapered portion 3b in contact with the second electrode 2 and a tip position (a top surface position) of a projected portion of the non-flat portion 3a can be set so as to be substantially parallel to a normal line of the second electrode 2 (a direction of the optical axis along the central axis 5 of the aperture 4), if necessary. This setting enables effective fulfillment of the functions of the non-flat portion and the tapered portion. The non-flat portion 3a can, of course, have projected portions with different top surface positions (heights).

In the present embodiment, the non-flat portion 3a and the tapered portion 3b are completely separately formed. A projected portion of the non-flat portion 3a extends substantially parallel to the surfaces of the electrodes 1 and 2. The term "substantially parallel" in the present invention refers not only to a case in which two objects are completely parallel, but also to a case in which two objects are nonparallel, to such a degree that the advantageous effects of the present invention can be achieved, and a case in which a plurality of projected portions projects in nonparallel to each other. Accordingly, even a case in which two objects are deliberately designed to be nonparallel and a case in which two objects are made nonparallel due to a machining error are permissible, as long as the advantageous effects of the present invention can be achieved.

According to the findings of the present inventor, even if there is an inclination of plus or minus three degrees, such a case can be regarded as being substantially parallel as long as the inclination does not cause adverse effects. The degree of inclination is desirably set within plus or minus one degree.

Figure 1C:
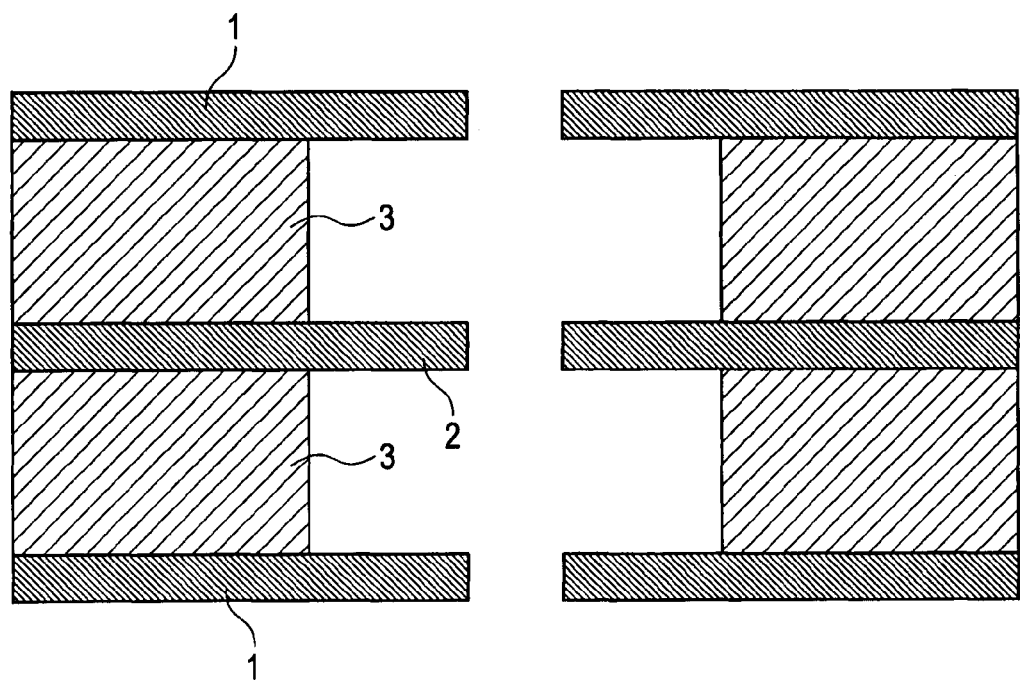
FIG. 1C is a cross-sectional view for describing a charged particle beam lens according to an embodiment of the present invention.

The configuration as in FIG. 1C is adopted when electrodes with the above-described configuration are used as an electrostatic charged particle beam lens. Note that details are also omitted in FIG. 1C. A charged particle beam lens in FIG. 1C is an Einzel electrostatic lens in which the electrodes 1 and supports 3 are arranged so as to be symmetric with respect to the second electrode 2 in FIG. 1A. The charged particle beam lens is made to function as an electrostatic lens by applying a ground potential to the two upper and lower electrodes 1 and a negative potential to the central electrode 2, for example.

Figure 2A:
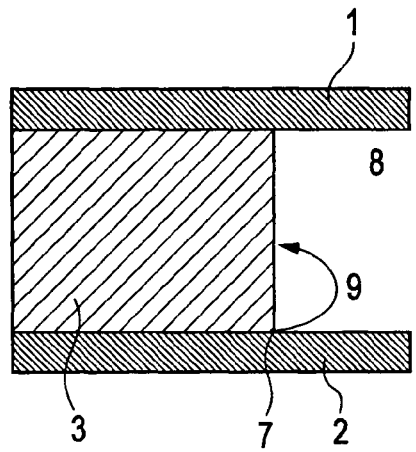
FIG. 2A is a cross-sectional view for describing the principle of inhibiting the charged state of a support of a charged particle beam lens according to the present invention from fluctuating.

A mechanism for stabilizing electrification of the support 3 with the above-described configuration will be described. A process during which a sip face of the support 3 (simply illustrated here as a flat surface) is electrically charged will first be described with reference to FIG. 2A. FIG. 2A illustrates one half of the charged particle beam lens in FIG. 1A, which is symmetric with respect to the central axis 5 of the aperture 4. When a ground potential is applied to the electrode 1 and a negative potential is applied to the electrode 2, a junction of the support 3, the electrode 2, and a vacuum region 8 serves as a triple junction 7 to cause electrical field concentration. In particular, an electron is emitted from the triple junction 7 on the cathode side into the vacuum region 8 due to the tunnel effect. The emitted electron flies, for example, as indicated by a trajectory 9 to collide with the support 3 or reaches the electrode 1 at the ground potential and is reflected from the electrode 1 with a certain probability to collide with the support 3. The support 3 emits a secondary electron from the surface. As a result, the surface of the support 3 is positively charged. The positively charged support 3 is more likely to attract an electron. The flight distance of a secondary electron to be more easily attracted decreases gradually, and the energy of collision with the support 3 decreases gradually. When collision energy reaches a level where the secondary electron emission coefficient of the support 3 is one, electrification is brought into equilibrium.

Since, however, electrons emitted from the triple junction 7 vary in emission angle and energy, the electrons vary widely in position, angle, and energy of collision with the support 3. The charged state of the support 3 fluctuates slightly. A secondary electron generated by collision of an electron with the support 3 repeats collision with the support 3 until the electron reaches an anode (the electrode 1), and variation in collision position causes wider fluctuations in charged state. For stabilization of the charged state, it is thus necessary to cause an electron emitted from the triple junction 7 to collide with the support 3 at a distance as far as possible and to reduce the number of collisions of an electron with the support 3 when the electron flies to the anode (electrode 1).

Figure 2B:
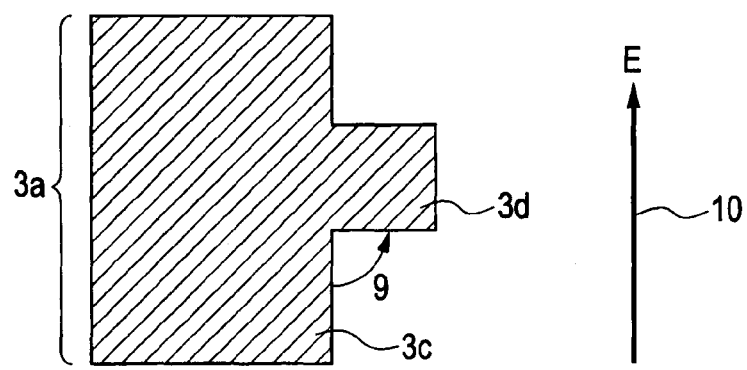
FIG. 2B is a cross-sectional view for describing the principle of inhibiting the charged state of a support of a charged particle beam lens according to the present invention from fluctuating.
Figure 2C:
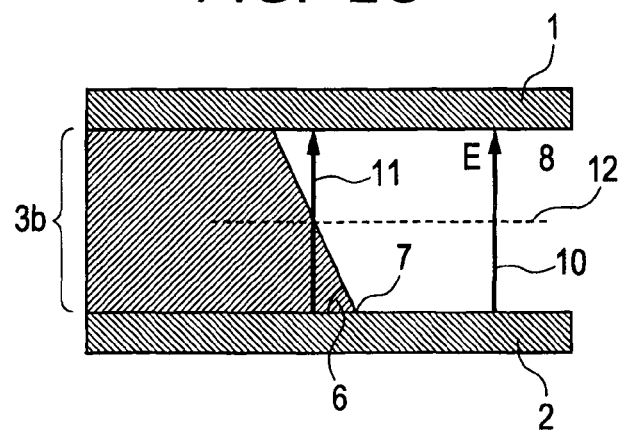
FIG. 2C is a cross-sectional view for describing the principle of inhibiting the charged state of a support of a charged particle beam lens according to the present invention from fluctuating.

A mechanism for stabilizing the charged state of the support 3 according to the present embodiment will be described with reference to FIGS. 2B and 2C. The function of a non-flat portion having a projected portion will first be described. FIG. 2B is an enlarged view of the non-flat portion 3a in FIG. 1B. FIG. 2B illustrates surfaces 3c and 3d of the projected portion, an electrical field 10 to be applied, and an electron trajectory 9. For example, if an electron collides with the surface 3c, the surface 3c emits a secondary electron at a position of the collision. The secondary electron behaves as indicated by the electron trajectory 9, for example. In this case, the surface 3c is positively charged at the collision position, and the emitted secondary election collides with the surface 3d. Since the flight distance to the collision is short, the secondary electron is not accelerated, and the amount of the energy of the collision is small. The surface 3d is negatively charged at a position of the collision. As a result, for the overall projected portion, electrical fields generated by positive and negative electrical charges cancel each other to produce the apparent effect of reducing the electrical charge.

Since a second electron repeats collision at the surface 3d, gradually loses energy, and then stops, an electron hardly moves to the anode (electrode 1). Accordingly, the number of times when an electron with energy collides again with the support 3 is reduced, and the electrical charge is inhibited from fluctuating. The depressed portion can be handled as having peak and valley positions shifted by a half cycle from peak and valley positions of the projected portion, and hence, the same as in the case of the projected portion occurs.

The function of a tapered portion in FIG. 2C will be described. The electrodes 1 and 2 are electrodes. The tapered portion 3b is inserted between the electrodes 1 and 2 to cause the electrodes 1 and 2 to have a potential difference. FIG. 2C also illustrates the electrical field component 10, which passes through only the vacuum region 8 between the electrodes 1 and 2, and an electrical field component 11, which passes through the tapered portion 3b and vacuum region 8. Consider here a potential at a position indicated by a dotted line 12 that is equidistant from the electrodes 1 and 2. Since the dielectric constant of the tapered portion 3b is not less than one, the electrical field component 11 is different in electrical field strength from the electrical field component 10, which passes through only the vacuum region 8. Accordingly, a position at which the electric field component 11 and the dotted line 12 cross and a position at which the electrical field component 10 and the dotted line 12 cross are different in potential to cause a potential difference. Especially, if the dielectric constant is not less than one, the potential at the position at which the electrical field component 11 and the dotted line 12 cross is lower than the potential at the position at which the electrical field component 10 and the dotted fine 12 cross. The potential difference produces the effect that an electron emitted from the triple junction 7 receives a force in a direction parallel to the dotted line 12 and moves away from the tapered portion 3b. If the taper angle 6 is one of zero degrees and ninety degrees, the dielectric constant is uniform on a path of the electrical field component 11, as in the electrical field component 12, the potential difference as described above is not generated. If the taper angle 6 is forty-five degrees, and the path of the electrical field component 11 has a large region at which the dielectric constant varies, the potential difference described above is large, and thus, the effect of moving an electron away from the tapered portion 3b is largest.

As described above, in the present embodiment, a tapered portion is provided on the cathode side to keep an emitted electron away from the support 3, and one of a projected portion and a depressed portion is provided on the anode side to reduce the amount of electrical charge and not to attract an electron. This reduces the number of collisions with the support 3 on the cathode side and on the anode side and stabilizes the charged state.

Example

An example in which specific materials and dimensions are applied to the first embodiment will be described. In the present example, electrodes 1 and 2 each are made of a single crystal silicon and have a thicknesses of one hundred micrometers. The diameter of an aperture 4 is thirty micrometers. A support 3 is made of glass that is an insulating material and has a thickness of four hundred micrometers. Ceramic, or the like, can be used as the material for the support 3 instead of glass. The support 3 is sandwiched between the electrodes 1 and 2, and the electrodes 1 and 2 are installed parallel to a plane, a normal of which is a central axis 5 of the aperture 4. A surface of a non-flat portion on the electrode 1 side of the support 3 has three projected portions, and the level difference of each projected portion (the difference between a bottom surface of a depressed portion and a top surface of the projected portion) is twenty micrometers. The support 3 also includes a tapered portion on the electrode 2 side, which is in contact with the electrode 2 to form an angle of seventy-five degrees. A ground potential was applied to the electrode 1, and a potential of −3.7 kV was applied to the electrode 2. When fluctuations in the amount of deflection of an electron beam passing through the aperture 4 were measured, an indication was that the present embodiment reduced fluctuations by 80%, compared to the support 3 with a smooth surface.

Figure 3A:
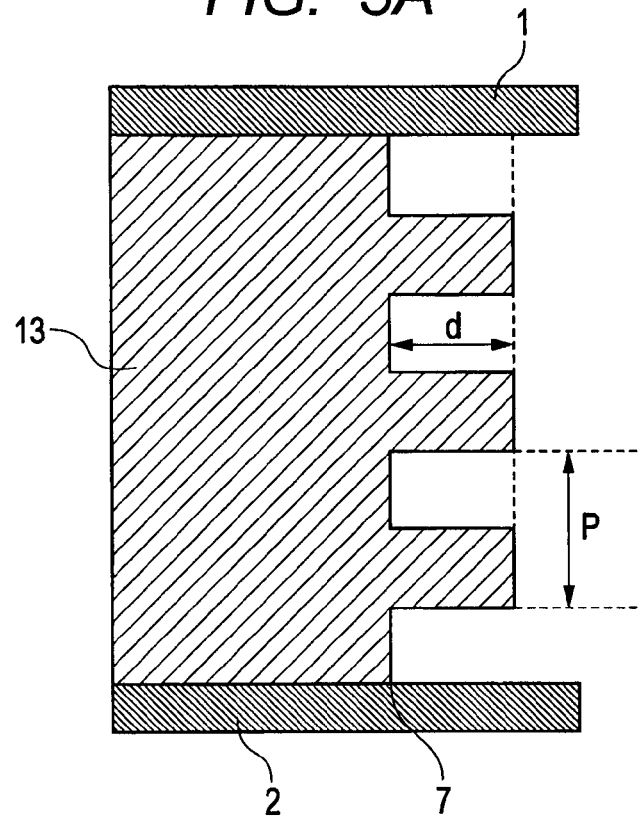
FIG. 3A is a cross-sectional view for describing the functions of a non-flat portion and a tapered portion of supports of the charged particle beam lens.

A desirable range for the surface shape of the support 3 will be described. A simulation of calculating an electrostatic field by the boundary element method and calculating an electron trajectory by the Monte Carlo method was performed to discuss the desirable range. FIG. 3A illustrates a configuration in which the tapered portion 3b has been omitted from the support 3 in FIG. 1B. FIG. 3A illustrates a level difference d [micrometer] between a projected portion and a depressed portion and a distance P [micrometer] between projected portions. Assume here that the distance P is eighty micrometers and that the ratio between the length of a projected portion and the length of a depressed portion is 1:1. A desirable range for a projected portion as illustrated in FIG. 3A will first be described. The function of the projected portion or the depressed portion is to form a barrier in a direction of motion of an electron and to prevent an electron flying from the cathode side (the electrode 2 side) from repeating collision until the electron reaches an anode. If a barrier in the direction of motion of an electron is low, however, an electron flies over the barrier. As a result, the electron having flown over the barrier repeats collision until the electron reaches the anode (the electrode 1 side). Accordingly, the rate of electrons flying over the projected portion was calculated while the level difference d [micrometer] of a support 13 illustrated in FIG. 3A was varied.

Figure 4A:
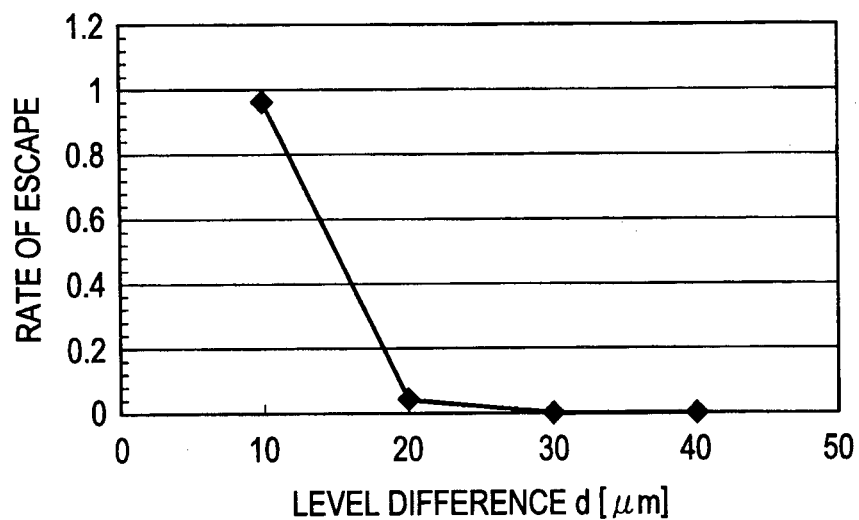
FIG. 4A is a graph for describing advantageous effects of the non-flat portion and tapered portion of the supports.

FIG. 4A illustrates a result of the calculation. The abscissa of FIG. 4A represents the level difference d [micrometer] while the ordinate represents the rate of electrons flying over the level difference d. The results showed that when the level difference d was twenty micrometers, the rate of escape from the projected portion was substantially zero. The level difference d is thus desirably not less than twenty micrometers.

Figure 3B:
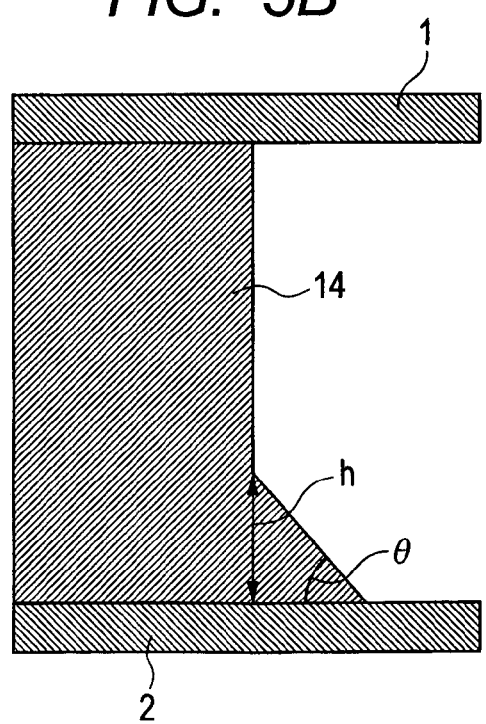
FIG. 3B is a cross-sectional view for describing the functions of a non-flat portion and a tapered portion of supports of the charged particle beam lens.

FIG. 3B illustrates a configuration in which the non-flat portion 3a has been omitted from the support 3 in FIG. 1B. FIG. 3B illustrates a taper angle θ. A region h of a support 14 where a tapered portion is provided is set to be eighty micrometers long. The function of the tapered portion is to keep an electron away from the support and to inhibit the charged state of the support from fluctuating. A charge variation was calculated while the taper angle θ degrees illustrated in FIG. 3B was varied.

Figure 4B:
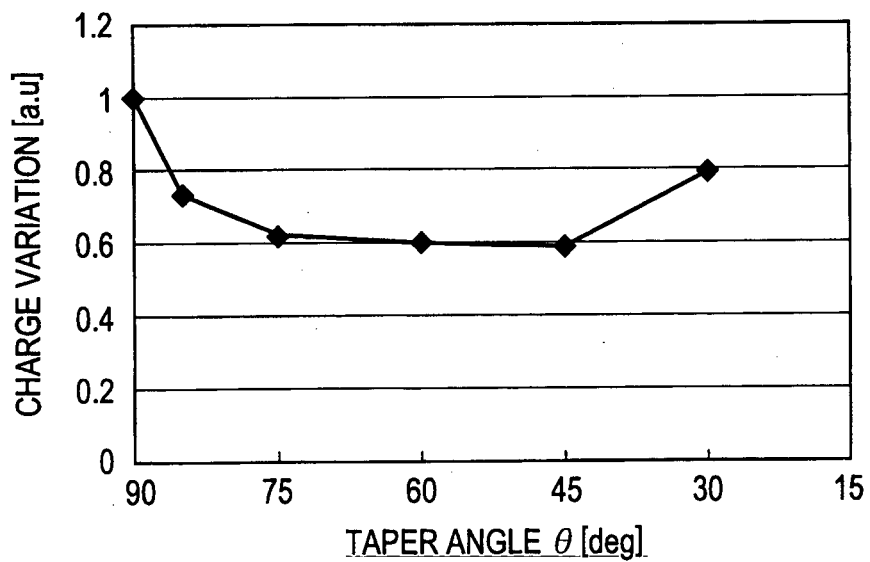
FIG. 4B is a graph for describing advantageous effects of the non-flat portion and tapered portion of the supports.

FIG. 4B illustrates a result of the calculation. The abscissa of FIG. 4B represents the taper angle θ degrees, while the ordinate represents a relative value when the charge variation in the case of a taper angle of ninety degrees is taken as one. The result shows that advantageous effects are stably obtained when the taper angle θ is not less than forty-five degrees and not more than seventy-five degrees.

Second Embodiment

A second embodiment of the present invention will be described with reference to FIGS. 5A and 5B. The present embodiment relates to a charged particle beam exposure device using a plurality of charged particle beams. Portions having the same functions as those in the first embodiment are denoted by the same reference signs, and a redundant description of the portions will be omitted.

Figure 5A:
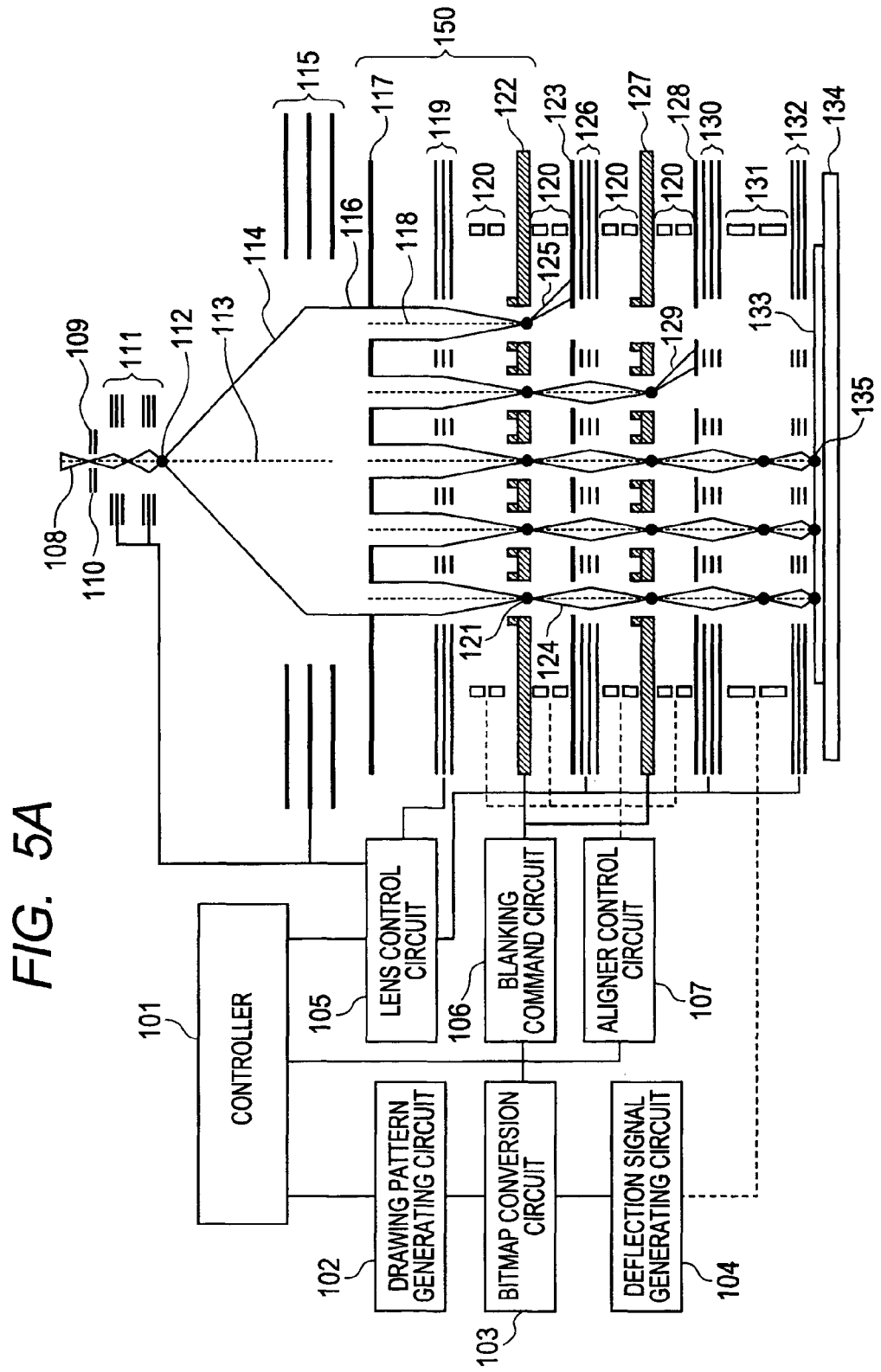
FIG. 5A is a diagram and a view for describing a charged particle beam exposure device according to an embodiment of the present invention.

FIG. 5A is a diagram illustrating the configuration of a multi charged particle beam exposure device according to the present embodiment. The exposure device of the present embodiment is a so-called multi-column type, one including individual projection systems. An emitted electron beam extracted from an electron source 108, serving as a charged particle source, by anode electrodes 109 and 110, forms an irradiation optical system crossover 112 by a crossover control optical system 111. As the electron source 108, a so-called thermionic electron source, such as LaB6 or BaO/W (dispenser cathode), is used. The crossover control optical system 111 includes two stages of electrostatic lenses. Each of the electrostatic lenses in the first and second stages includes three electrodes. The electrostatic lens is an Einzel electrostatic lens in which a negative voltage is applied to the middle electrode, and the top and bottom electrodes are grounded.

Electron beams 113 and 114 emitted from the irradiation optical system crossover 112 over a wide area are converted into parallel beams 116 by a collimator lens 115 and are applied to an aperture array 117. Multi electron beams 118 into which the beams are divided by the aperture array 117 are individually converged by a converging lens array 119 and are focused onto a blanker array 122. The aperture array 117, converging lens array 119, and blanker array 122 are denoted by reference numeral 150. The converging lens array 119 is an electrostatic lens including three porous electrodes (having a plurality of apertures) and is controlled by a lens control circuit 105. The converging lens array 119 is an Einzel electrostatic lens in which a negative voltage is applied to only the middle electrode of the three electrodes, and the top and bottom electrodes are grounded.

The aperture array 117 is placed at a pupil plane position of the converging lens array 119 (a front focal plane position of the converging lens array) so as to be responsible for defining a numerical aperture (NA) (convergence semi-angle). The blanker array 122 is a device including individual deflecting electrodes and individually turns on or off beams according to a drawing pattern, based on a blanking signal that is generated by a drawing pattern generating circuit 102, a bitmap conversion circuit 103, and a blanking command circuit 106. When the beam status is on, no voltage is applied to the deflecting electrodes of the blanker array 122. On the other hand, when the beam status is off, a voltage is applied to the deflecting electrodes of the blanker array 122 to deflect a multi electron beam. A multi electron beam 125 deflected by the blanker array 122 is blocked by a stop aperture array 123 in a subsequent stage (on the downstream side) and is turned off. A plurality of aligners 120 is controlled by an aligner control circuit 107 to adjust the incidence angle and incidence position of an electron beam. A controller 101 controls the entire circuit.

In the present embodiment, a blanker array has a two-stage configuration. A second blanker array 127 and a second stop aperture array 128 having the same structures as the structures of the blanker array 122 and stop aperture array 123 are arranged in a subsequent stage. A multi electron beam having passed through the blanker array 122 is focused onto the second blanker array 127 by a second converging lens array 126. The multi electron beam is further focused onto a wafer 133 by third and fourth converging lens arrays 130 and 132. The second converging lens array 126, third converging lens array 130, and fourth converging lens array 132 are Einzel electrostatic lens arrays, like the converging lens array 119.

In particular, the fourth converging lens array 132 is an objective lens, and the demagnification factor of the fourth converging lens array 132 is set to about one hundred. With this setting, an electron beam 121 (whose spot size is two micrometers in terms of FWHM) on an intermediate imaging plane of the blanker array 122 is reduced to one-hundredth on the surface of the wafer 133, and a multi electron beam whose spot size is about twenty nm in terms of FWHM is focused onto the wafer. A multi electron beam on the wafer 133 can be scanned by a deflector 131. The deflector 131 is formed of an opposing electrode and includes four stages of opposing electrodes for two-stage deflection in each of the x and y directions (a two-stage deflector is illustrated as one unit in FIG. 5A for simplicity). The deflector 131 is driven according to a signal from a deflection signal generating circuit 104.

During pattern drawing, the wafer 133 is continuously moved in the X direction by a stage 134. An electron beam 135 on the wafer surface is deflected in the Y direction by the deflector 131 based on a result of real-time length measurement by a laser length measuring machine. Additionally, the blanker array 122 and second blanker array 127 individually turn on or off beams according to a drawing pattern. A beam 124 is a beam that is on, while the beam 125 and a beam 129 are beams that are off. With the configuration, a desired pattern can be drawn on the surface of the wafer 133 at a high speed in a short drawing time.

As has been described above, a charged particle beam exposure device according to the present embodiment includes a charged particle source, an irradiation charged particle optical system that applies a charged particle beam emitted from the charged particle source, and a substrate having at least one aperture that is irradiated with the charged particle beam from the irradiation charged particle optical system. The charged particle beam exposure device also includes at least one deflector that individually deflects a charged particle beam from a plurality of apertures of the substrate to control blanking and includes a charged particle beam lens according to the present invention, which is provided at at least one position on the downstream side of a charged particle beam on the substrate and is capable of high-precision drawing.

FIG. 5B illustrates a charged particle beam lens that is the same as the charged particle beam lens described in the first embodiment with reference to FIG. 1C, except that a plurality of apertures 4 is present. An exposure device with fewer drawing errors can be obtained by installing the electrostatic lens as each of the first to fourth converging fens arrays 119, 126, 130, and 132 in the above-described multi charged particle beam exposure device.

While the present invention has been described with reference to exemplary embodiments, it is to be understood that the invention is not limited to the disclosed exemplary embodiments. The scope of the following claims is to be accorded the broadest interpretation so as to encompass all such modifications, and equivalent structures and functions.

The invention claimed is:

1. A charged particle beam lens comprising:
   a first electrode including a surface having at least one aperture;
   a second electrode including a surface having at least one aperture; and
   a support intervening between the first electrode and the second electrode to electrically insulate the first and second electrodes from each other and to support the first and second electrodes in a predetermined positional relationship,
   wherein a side surface of the support intervening between the first electrode and the second electrode includes a non-flat portion having at least one of a projected portion and a depressed portion and includes a tapered portion, and
   wherein a taper angle formed by the tapered portion and the surface having the aperture of the second electrode is greater than zero degrees and less than ninety degrees.

2. The charged particle beam lens according to claim 1, wherein the non-flat portion is formed on the side of the first electrode, the tapered portion is formed on the side of the second electrode, and the non-flat portion and the tapered portion are formed so as to be separate from each other or so as to overlap at least partially with each other.

3. The charged particle beam lens according to claim 1, wherein the non-flat portion includes a projected portion and a depressed portion, and a level difference between a top surface of the projected portion and a bottom surface of the depressed portion is not less than twenty micrometers.

4. The charged particle beam lens according to claim 1, wherein the taper angle formed by the tapered portion and the surface having the aperture of the second electrode is not less than forty-five degrees and not more than seventy-five degrees.

5. The charged particle beam lens according to claim 1, wherein a top position of the tapered portion in contact with the second electrode and a top surface position of the non-flat portion are collinear in a direction of an optical axis along a central axis of the aperture.

6. A charged particle beam exposure device comprising:
   a charged particle source for emitting a charged particle beam;
   an irradiation charged particle optical system that applies the charged particle beam emitted from the charged particle source;
   a substrate having at least one aperture that is irradiated with the charged particle beam from the irradiation charged particle optical system;
   at least one deflector that individually deflects charged particle beams from a plurality of apertures of the substrate to control blanking; and
   a charged particle beam lens according to claim 1, which is provided at at least one position on the downstream side of a charged particle beam on the substrate.

* * * * *